US006985843B2

(12) United States Patent
Kovacs-Birkas

(10) Patent No.: US 6,985,843 B2
(45) Date of Patent: Jan. 10, 2006

(54) CELL MODELING IN THE DESIGN OF AN INTEGRATED CIRCUIT

(75) Inventor: Attila Kovacs-Birkas, Santa Clara, CA (US)

(73) Assignee: NEC Electronics America, Inc., Santa Clara, CA (US)

( * ) Notice: Subject to any disclaimer, the term of this patent is extended or adjusted under 35 U.S.C. 154(b) by 749 days.

(21) Appl. No.: 09/878,497

(22) Filed: Jun. 11, 2001

(65) Prior Publication Data

US 2002/0199155 A1 Dec. 26, 2002

(51) Int. Cl.
*G06F 17/50* (2006.01)

(52) U.S. Cl. ............................ 703/15; 703/14; 703/15; 703/19; 716/7; 716/9; 716/10; 716/11; 716/17; 716/18

(58) Field of Classification Search .................. 703/13, 703/14, 15, 19, 20; 716/15, 8, 9, 6, 10, 2, 716/7, 11, 13, 17, 18
See application file for complete search history.

(56) References Cited

U.S. PATENT DOCUMENTS

| | | | | |
|---|---|---|---|---|
| 5,802,349 | A * | 9/1998 | Rigg et al. | 716/2 |
| 5,818,726 | A * | 10/1998 | Lee | 716/10 |
| 5,831,863 | A * | 11/1998 | Scepanovic et al. | 716/9 |
| 5,914,887 | A * | 6/1999 | Scepanovic et al. | 716/8 |
| 5,930,499 | A * | 7/1999 | Chen et al. | 716/8 |
| 5,984,510 | A * | 11/1999 | Guruswamy et al. | 716/9 |
| 6,006,024 | A * | 12/1999 | Guruswamy et al. | 716/12 |
| 6,058,252 | A * | 5/2000 | Noll et al. | 716/10 |
| 6,256,768 | B1 * | 7/2001 | Igusa | 716/11 |
| 6,269,467 | B1 * | 7/2001 | Chang et al. | 716/18 |
| 6,292,929 | B2 * | 9/2001 | Scepanovic et al. | 716/14 |
| 6,298,468 | B1 * | 10/2001 | Zhen | 716/7 |
| 6,308,309 | B1 * | 10/2001 | Gan et al. | 716/8 |
| 6,367,056 | B1 * | 4/2002 | Lee | 716/5 |
| 6,415,426 | B1 * | 7/2002 | Chang et al. | 716/9 |
| 6,446,239 | B1 * | 9/2002 | Markosian et al. | 716/10 |
| 6,449,761 | B1 * | 9/2002 | Greidinger et al. | 716/10 |
| 6,457,159 | B1 * | 9/2002 | Yalcin et al. | 716/6 |
| 6,519,749 | B1 * | 2/2003 | Chao et al. | 716/9 |
| 6,536,028 | B1 * | 3/2003 | Katsioulas et al. | 716/7 |
| 6,539,531 | B2 * | 3/2003 | Miller et al. | 716/15 |
| 6,557,153 | B1 * | 4/2003 | Dahl et al. | 716/11 |
| 6,625,787 | B1 * | 9/2003 | Baxter et al. | 716/6 |
| 6,629,630 | B2 * | 10/2003 | Adams | 227/180.1 |

(Continued)

OTHER PUBLICATIONS

Lefebvre et al., The Future of Custom Cell Generation in Physical Synthesis, ACM 1997.*

(Continued)

*Primary Examiner*—W. Thomson
(74) *Attorney, Agent, or Firm*—Skjerven Morrill LLP

(57) ABSTRACT

The invention relates to a method for modeling an input/output cell located on the perimeter of an integrated circuit. A method is taught to model an the integrated circuit when sufficient area is not available on the perimeter of the integrated circuit. The input/output cell can be modeled in two locations; one location on the perimeter of the cell and a second location in the interior area, or core, of the integrated circuit. The model uses a cover to prevent the area of the core of the integrated circuit from being used for other purposes. When the input/output cell is divided into a main cell and more than one pre-cell, the model uses a cover for each pre-cell. The model adjusts the timing of the signals to compensate for the input/output cell being divided into two areas. In an embodiment a software tool performs the functions of the model.

23 Claims, 6 Drawing Sheets

U.S. PATENT DOCUMENTS 6,756,242 B1 * 6/2004 Regan ......................... 738/14
6,757,874 B1 * 6/2004 Dahl et al. ..................... 716/2

OTHER PUBLICATIONS

Senouci et al., Timing Driven Floorplanning on Programmable Hierarchical Targets, ACM 1998.*
Dutt et al., Efficient Incremental Rerouting for Fault Reconfiguration in Field Programmable Gate Arrays, IEEE, 1999.*
Ginetti et al., Modifying The Netlist After Placement for Peformance Improvement, IEEE 1993.*
Stenz et al., Timing Driven Placement in Interaction with Netlist Transformations, ACM 1997.*
Benkoski et al., The Role of Timing Verificaiton in Layout Synthesis, ACM 1991.*
Donath et al., Transformation Placement and Synthesis, IEEE 2000.*

* cited by examiner

CELL MODELING IN THE DESIGN OF AN INTEGRATED CIRCUIT

FIELD OF THE INVENTION

The present invention generally relates to the manufacture of integrated circuits and more particularly to the design of a model for an integrated circuit input/output cell. More specifically, the invention relates to a method and a software tool for designing an integrated circuit.

DESCRIPTION OF THE RELATED ART

Digital circuits, no matter how complex, are composed of a small group of identical building blocks. These blocks can be basic logic gates (AND, OR, etc.), memory cells or other structures. But the majority of digital circuits are composed of gates or combinations of gates. Gates are combinations of high-speed electronic switches or transistors. Memory cells are modified versions of basic logic gates. A flip-flop, for example, can be considered as a function block, but it is composed of interconnected gates. A microprocessor is a central processing unit of a computer or other device using thousands (or millions) of gates, flip-flops and memory cells.

It is known to manufacture an integrated circuit using conductors separated by a semi-conductor. Circuits are fabricated on a semiconductor, such as silicon, by selectively altering the conductivity of the semiconductor material. Various conductivity levels correspond to elements of a transistor. Transistors, diodes, resistors, and small capacitors are formed on small chips of silicon. Individual components are interconnected by wiring patterns (typically aluminum or gold) that resemble ordinary printed circuit wiring. Integrated circuits are then mounted on etched circuit boards which are used to assemble electronic systems such as personal computers and other data processing equipment.

It is known to use commercially available software to model certain features of integrated circuits. For example, Verilog is a hardware description language (HDL) most predominantly used in the United States. Verilog was originally designed by Gateway Design Automation in approximately 1985. Verilog was made available to the public in 1990 and has been adopted as a standard by the Institute of Electrical and Electronic Engineers (IEEE). Verilog is commonly used to develop a list of functions of an integrated circuit. Verilog is also commonly used to identify or list the number of input/out pins required to support the functions identified. When the list of required functions and the list of I/O pins is combined it is commonly referred to as a "netlist." A netlist can form a basic specification from which a manufacturer can complete the design and manufacture and integrated circuit.

Integrated circuits are designed using computer-aided design (CAD) tools. The integrated circuit design process includes constructing the integrated circuit design out of simple circuits (standard cells) that are connected together electrically using wire interconnects. The standard cells and connections between them are stored in databases called "netlists" (i.e., lists of symbolic interconnections).

As part of the design process, the design information within a netlist is "placed and routed" by the CAD tool. The CAD tool utilizes placing and routing processes (also called placers and routers) that are typically software programs executed on the CAD tool. The placer determines the optimum location of each standard cell within the integrated circuit layout on the semiconductor surface. The placement location is optimized to reduce the distance between standard cells that are electrically connected to each other by wire interconnects (e.g., input/output lines). This is done to minimize semiconductor area consumed by the integrated circuit and is also done to minimize the lengths of wire interconnects to reduce net capacitance within the design. The router optimizes the routing of input/output lines between connected standard cells so that areas of the integrated circuit layout do not become overly congested by input/output lines.

The IC design is next verified at the logical level, using the functions and the timing characteristics supplied in the cell library, to determine whether the design is functionally correct and meets the desired timing requirements. This testing is typically performed using a logic simulation tool, such as Verilog, and other timing analysis tools. Such tools take into account the estimated capacitive loads of physical (mask) interconnections, cell delay times, sequential cell set-up and hold times and other factors important to achieving an accurate simulation of the IC function and performance. Since capacitive loading due to the physical interconnections is not known at this stage, estimates are used.

After logic simulation and timing analysis are successfully completed, cell interconnections are physically routed according to the design netlist. Cell placement and routing are typically automated using a placement and route tool as mentioned above.

A short netlist for a simple circuit is shown in Table 1:

TABLE 1

| Exemplary Netlist |
| --- |
| XOR A B C |
| XOR C CN1 Y |
| AND A B CA |
| AND C CN1 CB |
| NOR CB CA CN |

The netlist defines all of the interconnections between the components of the circuit. Each "signal" which interconnects two or more cells, or which represents an input or output for the entire circuit, is actually a node in the circuit which has been assigned a name. Thus the terms "signal" and "node" are often used interchangeably. In the exemplary netlist shown in Table 1, signals A, B and CN1 are input nodes to the entire circuit, Y and CN are output nodes for the entire circuit, and nodes C, CA and CB are internal nodes.

Electronic design automation (EDA) tools were originally designed to simulate logic. As electronic design tools became more popular, vendors began to provide enhanced functions. EDA tools are now used to drive synthesis, timing, simulation, test and other tools. Other vendors of EDA tools are: Cadence Corporation, Providence R.I.; Mentor Graphics, Wilsonville, Oreg.; Snyopsys, Mountainview, Calif.; and Snytest Technologies, Inc., Sunnyvale, Calif. These corporations are listed as examples only, other manufactures use proprietary tools for the same purpose. For example the Silicon Ensemble tool provided by Cadence places and routes wires on the integrated circuit driven by timing constraints.

Sub-micron designs of integrated circuit chips require accurate timing analysis to prevent operational errors. These timing errors create operational errors which prevent a design, or a manufactured chip, from accomplishing its intended purpose. It is known to use available software tools to design an integrated circuit and to model the functions and timing of the signals on the circuit. For example, the Ensemble tool provided by Cadence develops a design to place and route wires based on timing constraints for the integrated circuit.

Referring to FIG. 1, integrated circuit chip 110 with perimeter input/output cells (I/O cells) and core area 140 is shown. Specifically, I/O cell 120 is located on the perimeter of the chip. I/O cell 120 includes I/O pad (input/output pad) 130. As previously discussed, for commercial reasons it is often advantageous for a chip area to be as small as possible. Reducing the size of a chip necessarily reduces the perimeter. When the perimeter of a chip is reduced the area available on the perimeter of the chip is also reduced. The perimeter area on the chip may have insufficient area to support I/O cells of sufficient number and size. The perimeter area can have an I/O cell with an area insufficient to support the function of the cell. For example, an I/O cell may require a larger area than available on the perimeter of the integrated circuit chip when the area of an I/O cell is reduced. In this instance additional area in the core of the chip is utilized.

Commercially available software tools can model an I/O cell on the perimeter of an integrated circuit. However, in some cases insufficient area is available on the perimeter of the integrated circuit chip to support the required number of I/O cells. When the area available on the perimeter of a chip is not sufficient to support the function of an I/O cell it is known to utilize a separate area in the core of the chip as a pre-cell.

Referring now to FIG. 2, main I/O cell 210 is located on the perimeter of integrated circuit chip 210. However, in this instance the area available on the perimeter integrated circuit chip 210 is deemed to be less than the area necessary to support the function of the I/O cell. In this case, an additional area, referred to as main I/O cell 210, has been designated in the core of integrated circuit chip 210 to support the function of the cell previously shown as I/O cell 120 (in FIG. 1). The additional area from the core of the chip is indicated on FIG. 2 as pre-cell 230. Thus two areas are allocated to support the function of the I/O cell, an area indicated as main I/O cell 210 and an area indicates as pre-cell 230. Main I/O cell 210 and pre-cell 230 are connected by internal core connection 265. I/O pad 215 facilitates connections from an external signal to integrated circuit chip 210.

As described above, an I/O cell can be divided into two cells; a main cell located on the perimeter of the integrated circuit and a pre-cell located in the core area. When an I/O cell is divided into two areas to satisfy perimeter area constraints, available EDA tools can introduce errors into the chip design. What is needed is a method to model an I/O cell which has been divided into two areas; one on the perimeter of the chip and a second area in the core of the chip. If would be further advantageous of the method is applicable to modeling an I/O cell which has been divided into three or more areas including one area on the perimeter of the chip and two or more areas in the core area of the integrated circuit.

SUMMARY OF THE INVENTION

The invention relates to a method for modeling an input/output cell located on the perimeter of an integrated circuit. When the area available on the perimeter of an integrated circuit is not be large enough to support the required number of input/output cells additional area from the core of the cell can be used to support the function of the perimeter cell. A method is taught to more accurately model the function of the integrated circuit. The input/output cell can be modeled in two locations; one location on the perimeter of the cell and a second location in the interior area, or core, of the integrated circuit. The model uses a cover to prevent the area of the core of the integrated circuit from being used for other purposes. When the input/output cell is divided into a main cell and more than one pre-cell, the model uses a cover for each pre-cell. The model adjusts the timing of the signals to compensate for the input/output cell being divided into two areas. In an embodiment a software tool performs the functions of the model.

The foregoing is a summary and this contains, by necessity, simplifications, generalizations and omissions of detail; consequently, those skilled in the art will appreciate that the summary is illustrative only and is not intended to be in any way limiting.

BRIEF DESCRIPTION OF THE DRAWINGS

The present invention may be better understood, and its numerous objects, features, and advantages made apparent to those skilled in the art by referencing the accompanying drawings. The use of the same reference symbols in different drawings indicates identical items unless otherwise noted.

FIG. 5 depicts the logical steps of a software tool to model an input/output function which utilizes locations on the perimeter and the interior of an integrated circuit.

DETAILED DESCRIPTION

The following sets forth a detailed description of a mode for carrying out the invention. The description is intended to be illustrative of the invention and should not be taken to be limiting.

Figure 1:
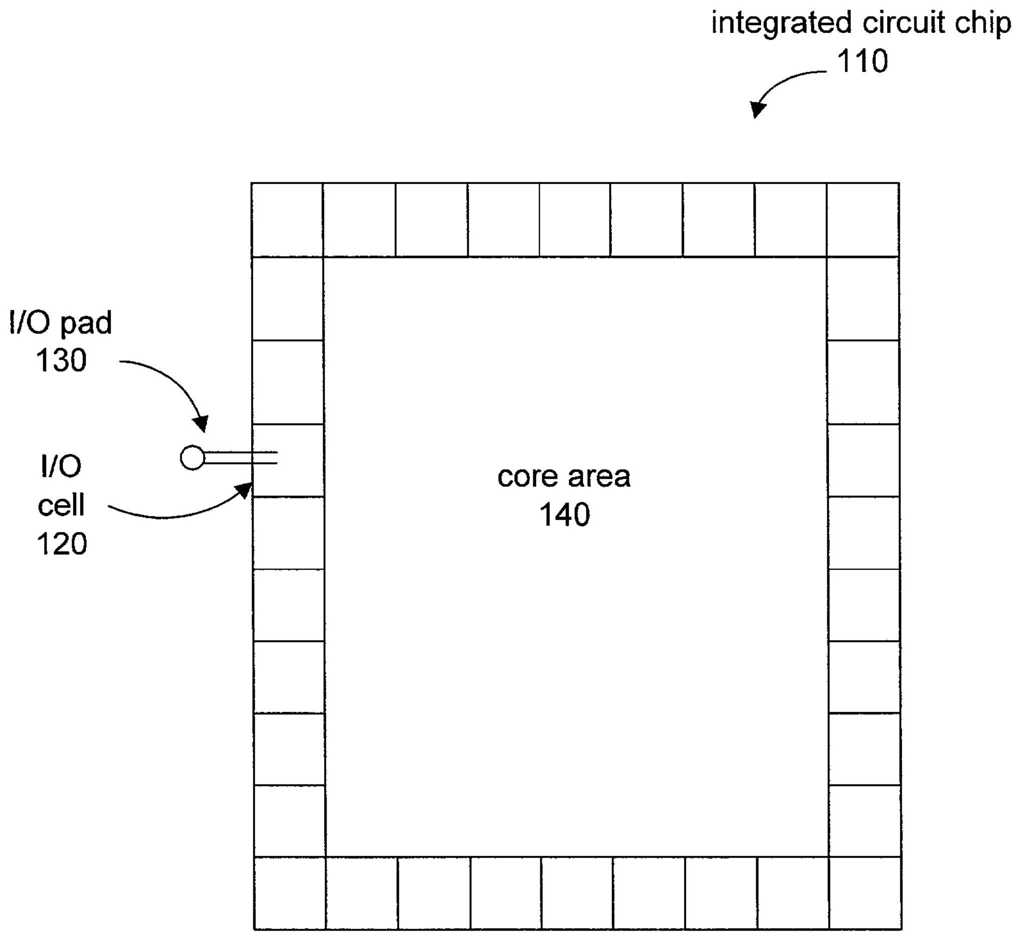
FIG. 1 depicts an integrated circuit in the prior art having a core area and an I/O cell on the perimeter.
Figure 2:
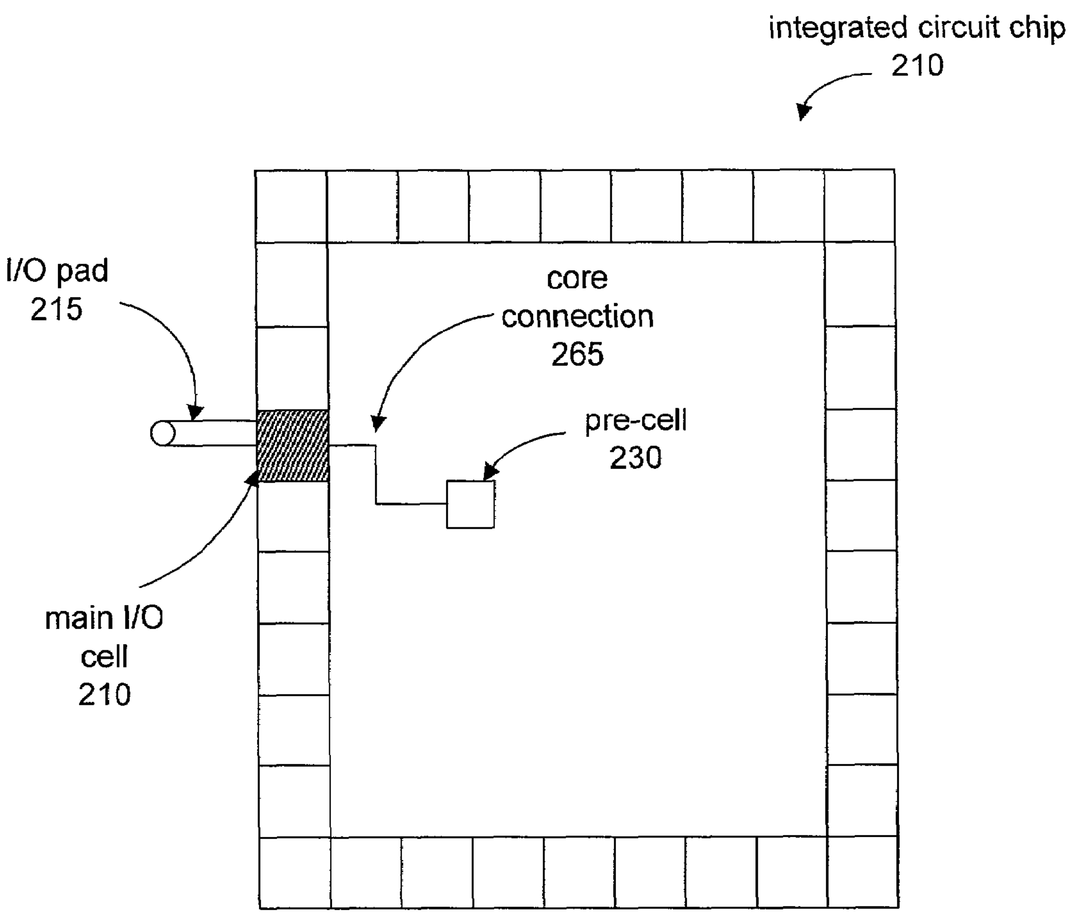
FIG. 2 depicts an integrated circuit in the prior art having a main I/O cell and a pre-cell. (The main I/O cell and pre-cell replace the I/O cell shown in FIG. 1.) An I/O pad and core connection has been added.
Figure 3A:
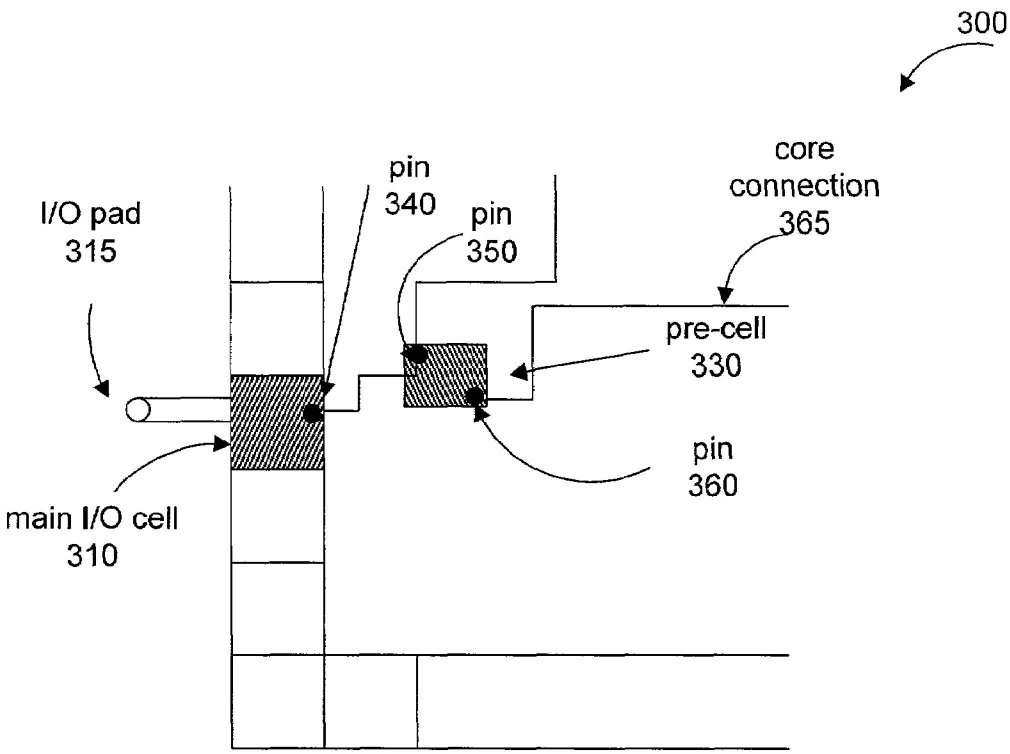
FIG. 3A depicts an integrated circuit with a main I/O cell and a pre-cell in accordance with the present invention. Additional pins and core connections have been added to support a second block. In accordance with the present invention, FIG. 3B further depicts an outline of a cover added to prevent the pre-cell from being used for another function.
Figure 3B:
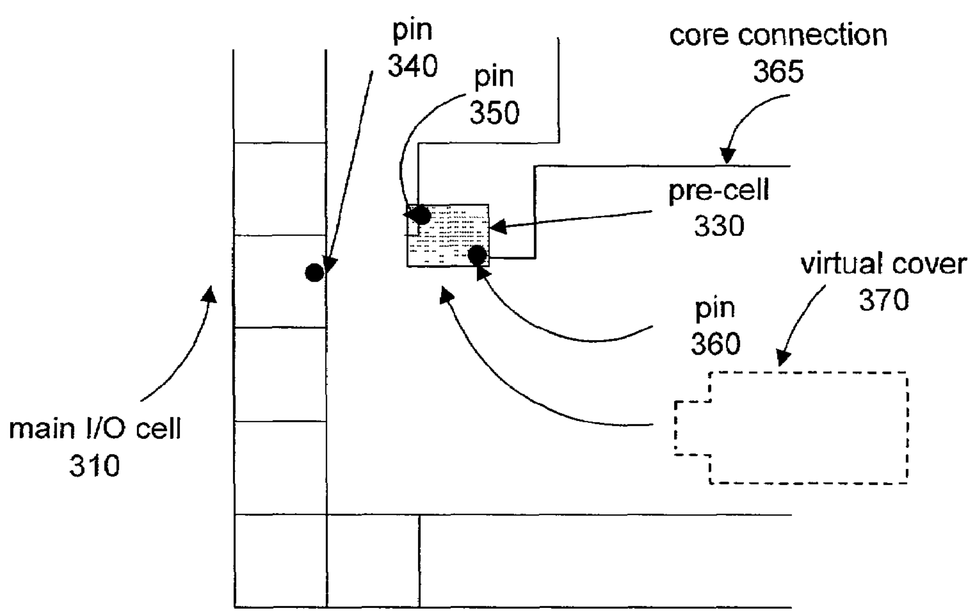

FIG. 3A depicts one embodiment of an integrated circuit with main I/O cell 310 and pre-cell 330 constructed in accordance with the present invention. I/O pad 315 is used to connect an incoming signal from the package to the integrated chip. Pins 340, 350 and 360 have been added to support the addition of a separate pre-cell. FIG. 3B further depicts virtual cover 370. As shown in FIG. 4, cover 370 is used to prevent the area designated as pre-cell 330 from being used for any other function.

Figure 4A:
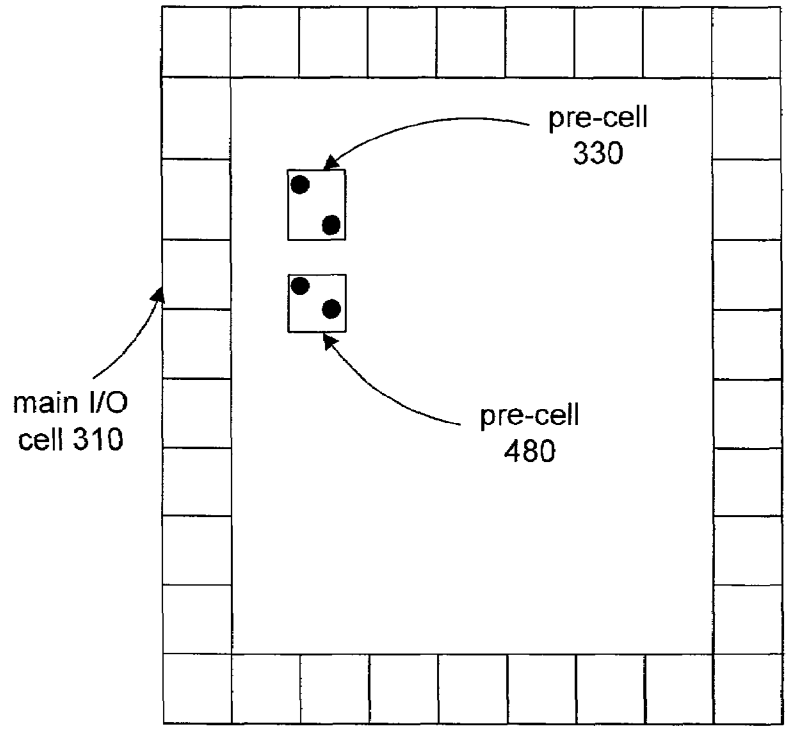
FIG. 4A depicts an integrated circuit with a main-cell and two pre-cells in accordance with the present invention.

The method taught is applicable to an I/O cell which has been divided into a perimeter area and a plurality of areas in the core of the integrated circuit chip. FIG. 4A depicts an integrated circuit with a main-cell and two pre-cells. Pre-cell

Figure 4B:
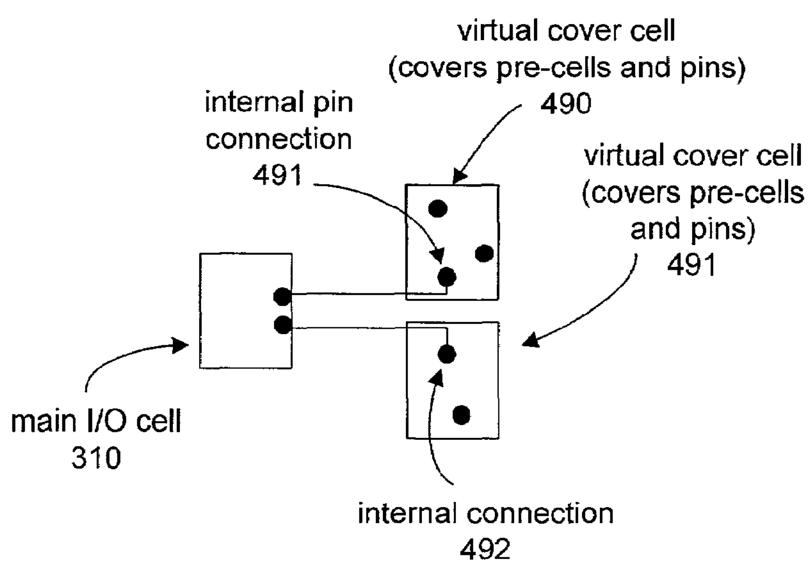
FIG. 4B further depicts the outline of a cover placed over the main cell and the two pre-cells.

480 has been added. FIG. 4B depicts the outline of virtual cover 490. Virtual cover 490 prevents the area designated as pre-cell 330 and 480 from being used for any other purpose. Virtual cover 490 like virtual cover 370 (shown previously in FIG. 3) are not actual physical covers or components.

The virtual cover (also referred to as a "cover") is a software function used to designate the areas occupied by certain pre-cells as not available for use. The virtual cover is not physically placed over the cells but is a conceptual function only implemented within the method taught. The virtual cover is theoretically placed over the I/O and the pre-cell. The virtual cover is a theoretical boundary.

In an embodiment, the virtual cover is implemented within the circuit design software tool. When used in conjunction with a software tool, the virtual cover is a software function only. The software function of the virtual cover enables two cells (a main I/O cell and a pre-cell) to be modeled as a single cell. The virtual cover prevents the area designated as pre-cells from being identified by the software tool for use as another function and improves the timing accuracy of the model. The software tool determines the boundary of the cover and reserves the area bounded by the cover. The software tool prevents any other use of this area defined by the virtual cover.

Still referring to FIG. 4B, the virtual cover can be thought of as physically covering pre-cell 230 and 480. Similarly, virtual cover 490 can be thought of as physically covering all pre-cells associated with main I/O cell 210. However, as previously explained cover 490 is a virtual cover, not an actual cover, and represents a software function as further explained below. Internal connections 491 and 492 are also shown from pre-cells 230 and 480 to main I/O cell 210.

Figure 5:
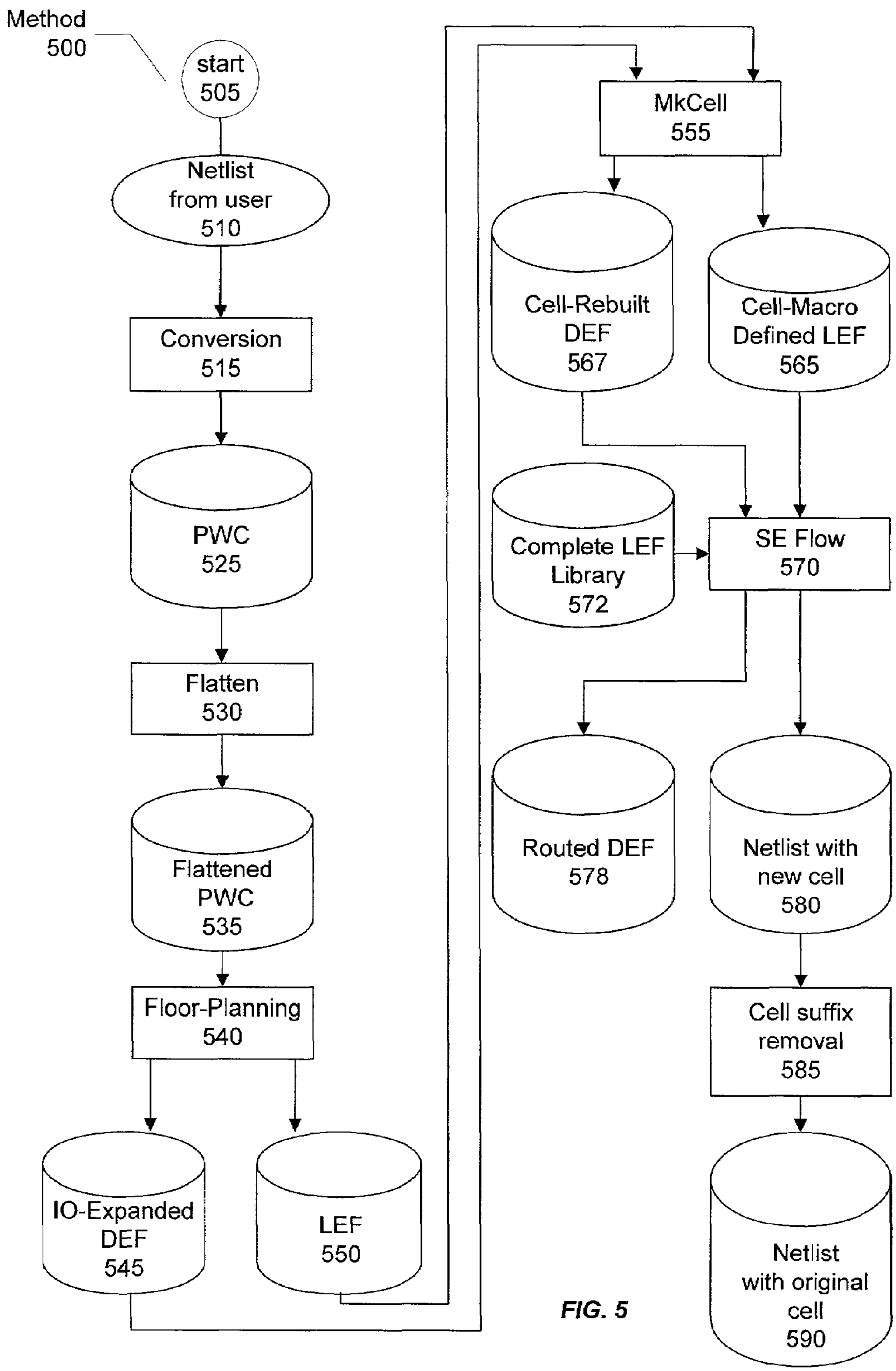
FIG. 5 is a flow diagram in accordance with the present invention.

An Embodiment:

FIG. 5 illustrates an embodiment of a software program to complete certain implementations of the present invention. FIG. 5 is a flow diagram of the logical steps of a software tool to model an input/output cell utilizing areas on the perimeter and the interior of an integrated circuit. Referring to FIG. 5, a manufacturer or designer determines to use a software tool to facilitate design of the integrated circuit. When a design begins, (identified as start 505) netlist 510 is generated. Netlist 510 facilitates the design of an integrated circuit and lists the functions and corresponding input/output cells required.

Still referring to FIG. 5, Conversion 515 converts netlist 510 from one proprietary format into the manufacturer's proprietary format. For example, the first proprietary format could be PWC as used by NEC Electronics, Santa Clara, Calif.

Thus PWC 525, the output of Conversion 515, represents netlist 510 in a manufacturer's proprietary format. Flatten 530 changes the hierarchical netlist into a flattened netlist. A flattened netlist refers to the function of the same block multiple times. A flattened netlist lists individual reference blocks without referring to the same reference block three times. Flatten PWC 535 is a database storing netlist 510 in a proprietary format with each block listed individually. Listing each block individually removes the hierarchy otherwise found in netlist 510.

Floor-planner 540 identifies the X and Y coordinate of each I/O cell in the integrated circuit. I/O Expanded DEF 545 includes the physical location of each I/O cell divided into a pre-cell and an I/O cell. LEF 550 is a software library describing the physical description of each cell in the integrated circuit. For example I/O cells, core area cell with the boundary and its physical location of the pin of the cells.

MkCell 555 combines the representation of the pre-cell and the main cell into a single I/O cell. (MkCell 555 generates the cover and places the cover over the pre-cells as shown previously in FIGS. 3 and FIG. 4.) MkCell 555 provides input for Cell-Rebuilt DEF 567 and Cell-Macro Defined LEF 565. Cell-Rebuilt DEF 567 combines netlist of pre-cells and main cells and provides input to SE Flow 570. Cell-Macro Defined LEF 565 is the library describing the merged pre-cell and main cell and also provides input to SE Flow 570. Complete LEF library 572 are other library elements including all other cells used in the netlist.

SE Flow 570 is the entire placement and routing of wires for the integrated circuit. SE Flow 570 provides input to Routed DEF 578 and Netlist with new cell 580. Routed DEF 578 is the file that includes placement and routing information for each cell and wire on the integrated circuit. Netlist with new cell 580 is the new netlist including changes to the netlist during SE Flow 570. Netlist with new cell 580 provides input to Cell suffix removal 585. Cell suffix removal 585 removes the suffix of the original I/O cell type. Cell suffix removal 585 provides input to Netlist with original cell 590. (The suffix is removed so that the cell type will match the cell type used in netlist from user 510.) Netlist with original cell 590 is a netlist from 580 without a suffix which matches the cell type used in netlist from user 510.

An Example System for Implementing the Method

The present disclosure is applicable to any integrated circuit including data processing systems. Integrated circuits may be found in many components of a typical computer system, for example a central processing unit, memory, cache, audio controller, network interface, I/O controller and I/O device as shown in the example below. Integrated circuits are found in other components within a computer system such as a display monitor, keyboard, floppy and hard disk drive, DVD drive, CD-ROM and printer. However, the example of a computer system is not taken to be limiting. Integrated circuits are ubiquitous and are found in other electrical systems such as stereo systems and mechanical systems including automobiles and aircraft.

Figure 6:
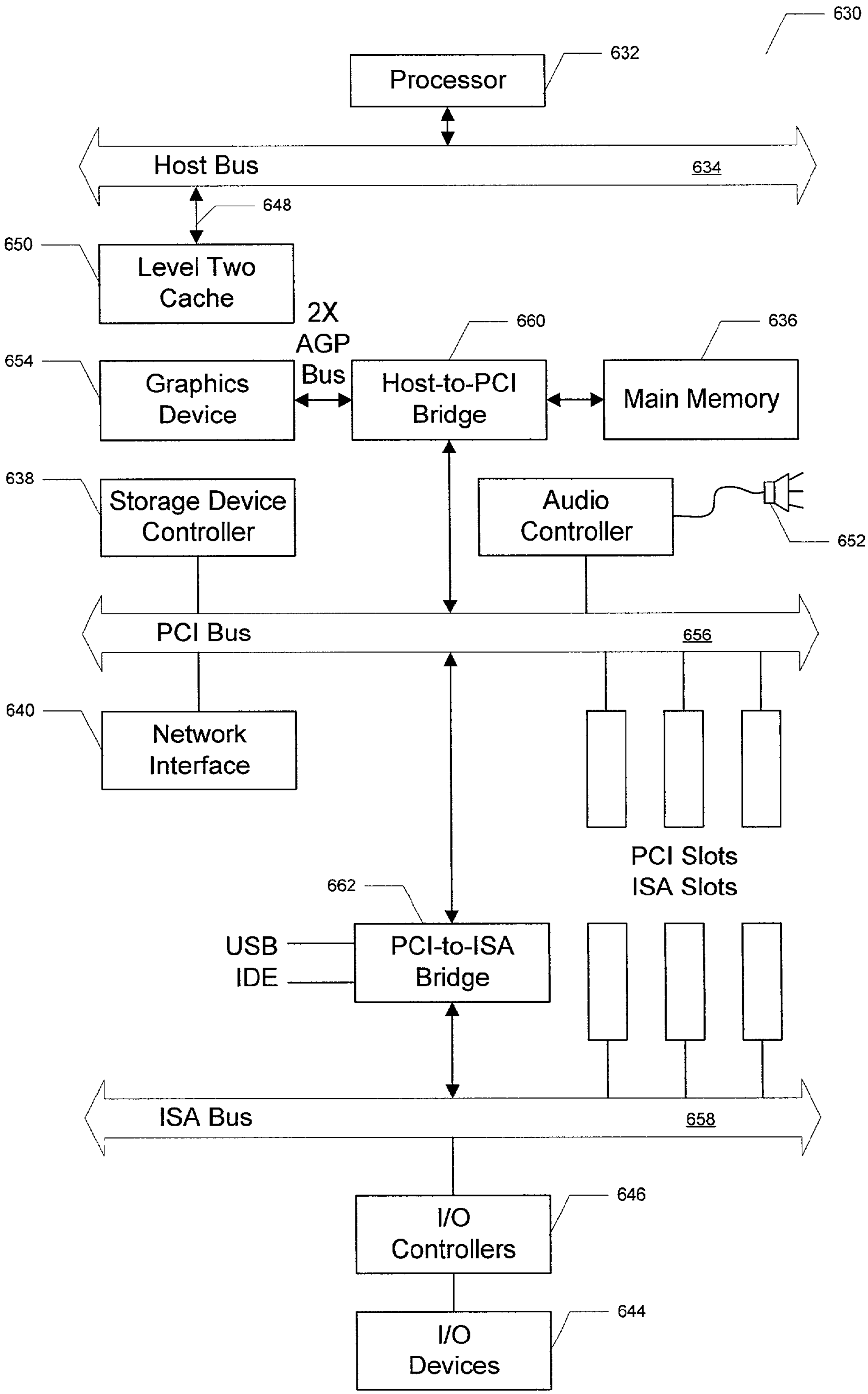
FIG. 6 is a block diagram of a computer system suitable for implementing embodiments of the present invention.

FIG. 6 is a block diagram of an exemplary computer system 630. FIG. 6 is intended to be illustrative of a computer system and should not be taken to be limiting. Computer system 630 includes central processing unit (CPU) 632 connected by host bus 634 to various components including main memory 636, storage device controller 638, network interface 640, audio and video controllers 642, and input/output devices 644 connected via input/output (I/O) controllers 646. Those skilled in the art will appreciate that this system encompasses all types of computer systems including, for example, mainframes, minicomputers, workstations, servers, personal computers, Internet terminals, network appliances, notebooks, palm tops, personal digital assistants, and embedded systems.

Typically computer system 630 also includes cache memory 650 to facilitate quicker access between processor 632 and main memory 636. I/O peripheral devices often include speaker systems 652, graphics devices 654, and other I/O devices 644 such as display monitors, keyboards, mouse-type input devices, floppy and hard disk drives, DVD drives, CD-ROM drives, and printers. Many computer systems also include network capability, terminal devices, modems, televisions, sound devices, voice recognition devices, electronic pen devices, and mass storage devices such as tape drives. The number of devices available to add to personal computer systems continues to grow, however computer system 630 may include fewer components than shown in FIG. 6 and described herein. The peripheral devices usually communicate with processor 632 over one or more buses 634, 656, 658, with the buses communicating with each other through the use of one or more bridges 660, 662.

The method disclosed is not restricted to a specific software, software language or software architecture. Each of the steps of the method disclosed may be performed by a module (e.g., a software module) or a portion of a module executing on a computer system. Thus, the above component organization may be executed on a desk top computer system or other appropriate system. The method may be embodied in a machine-readable and/or computer-readable medium for configuring a computer system to execute the method. Thus, the software modules may be stored within and/or transmitted to a computer system memory to configure the computer system to perform the functions of the module.

The operations described above and modules therefor may be executed on a computer system configured to execute the operations of the method and/or may be executed from computer-readable media. The method may be embodied in a machine-readable and/or computer-readable medium for configuring a computer system to execute the method.

Those of skill in the art will recognize that, based upon the teachings herein, several modifications may be made to the embodiments shown in FIGS. 1–6. For example, FIG. 6 is used as an example of a computer system containing an integrated circuit. Other electronic devices such as radios, telephones, televisions, calculators and automobiles contain integrated circuits which are subject to including an integrated circuit manufactured by the method disclosed.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A computer program product, encoded in computer readable media, the computer program product for designing an integrated circuit chip, comprising:

a first set of instructions, executable on a computer system, the first set of instructions configured to model an input/output cell located on a perimeter of an integrated circuit, the model of the input/output cell comprising:

a model of a main cell; and a model of a pre-cell; and a second set of instructions, executable on the computer system, the second set of instructions configured to model a cover wherein the cover prevents an area occupied by the pre-cell from being used for any other purpose.

2. The computer program product as recited in claim 1, further comprising:

a third set of instructions, executable on the computer system, the third set of instructions configured to adjust signal timing of the main-cell and pre-cell models, wherein the signal timing adjustment to the main cell and pre-cell models approximates a signal timing of the input/output cell.

3. The computer program product as recited in claim 1, wherein the model of input/out put cell comprises a second pre-cell;

wherein the second set of instructions are configured to model a second cover, wherein the second cover prevents an area occupied by the second pre-cell from being used for any other purpose.

4. The computer program product as recited in claim 1, the computer program product further comprising:

a database, wherein the database stores a netlist.

5. The computer program product as recited in claim 1, the computer program product further comprising:

a third set of instructions, executable on the computer system, the third set of instructions configured to convert a netlist to a proprietary format.

6. The computer program product as recited in claim 1, further comprising:

a third set of instructions, executable on the computer system, the third set of instructions configured to flatten a netlist by reading a description of a function of a cell and listing each function of the cell individual.

7. The computer program product as recited in claim 1, further comprising:

a third set of instructions, executable on the computer system, the third set of instructions configured to identify a location of each pin in an integrated circuit.

8. The computer program product as recited in claim 1, further comprising:

a third set of instructions, executable on the computer system, the third set of instructions configured to identify a location of each cell in an integrated circuit.

9. A method of modeling an input/output cell on a perimeter of an integrated circuit and at a location in a core area of the integrated circuit, the method comprising:

modeling the input/output cell, wherein the input/output cell model comprises:

a model of a main cell; and a model of a pre-cell; and modeling a cover wherein the cover prevents an area designated to be occupied by the model of the pre-cell from being used for any other purpose.

10. An integrated circuit manufactured by the method as recited in claim 9.

11. The method as recited in claim 9, further comprising:

adjusting a signal timing of the main-cell and pre-cell models, so that the signal timing of the main cell and the pre-cell models approximates a signal timing of input/output cell.

12. The method as recited in claim 9, further comprising:

modeling a second cover;

wherein the input/output cell comprises a second pre-cell model, wherein the first cover prevents use of the area of the first pre-cell and the second cover prevents use of the area covered by the second pre-cell;

wherein the second cover prevents an area designated to be occupied by the model of the second pre-cell from being used for any other purpose.

13. The method as recited in claim 9, further comprising:

storing a netlist.

14. The method as recited in claim 9, further comprising:

converting a netlist to a proprietary format.

15. The method as recited in claim 9, further comprising:

listing each function of a cell individually.

16. The method as recited in claim 9, further comprising:

identifying a location of each pin in the integrated circuit.

17. The method as recited in claim 9, further comprising:

identifying a location of each cell in the integrated circuit.

18. A computer system, comprising:

a memory; and a central processing unit, wherein the central processing unit is designed to execute instructions of a computer program stored in the memory, the computer program comprising:

a first set of instructions configured to model an input/output cell located on a perimeter of an integrated circuit; the model of the input/output cell comprising:

a model of a main cell; and a model of a first pre-cell; and a second set of instructions configured to model a cover wherein the cover prevents an area occupied by the first pre-cell from being used for any other purpose.

19. The computer system as recited in claim 18 wherein the computer program further comprises:

a third set of instructions configured to adjust a signal timing of the main-cell and pre-cell models, so that the signal timing of the main cell and first pre-cell models approximates a signal timing of the input/output cell.

20. The computer system as recited in claim 18, wherein the computer program further comprises:

a third set of instructions configured to model a second cover;

wherein the input/output cell comprises a model a second pre-cell;

wherein the second cover prevents use of an area occupied by the second pre-cell from being used for any other purpose.

21. The computer system as recited in claim 18, further comprising:

a database, wherein the database stores a netlist.

22. The computer system as recited in claim 18 wherein the computer program further comprises:

a third set of instructions, the third set of instructions configured to convert a netlist to a proprietary format.

23. The computer system as recited in claim 18 wherein the computer program further comprises:

a third set of instructions, the third set of instructions configured to read a description of a function of a cell and list each function of the cell individually, wherein reading the description of the function of the cell and listing each function of the cell individually is referred to as flattening a netlist.

* * * * *